(12) United States Patent
Shimauchi et al.

(10) Patent No.: US 10,110,215 B2
(45) Date of Patent: Oct. 23, 2018

(54) COMPARATOR, AD CONVERTER, SEMICONDUCTOR INTEGRATED CIRCUIT, AND ROTATION DETECTOR

(71) Applicant: MITSUBISHI ELECTRIC CORPORATION, Tokyo (JP)

(72) Inventors: Hideki Shimauchi, Tokyo (JP); Kanji Kitamura, Tokyo (JP); Mutsuo Daito, Tokyo (JP); Akio Kamimurai, Tokyo (JP); Masatoshi Uchino, Tokyo (JP); Yoshinori Tatenuma, Tokyo (JP); Akira Koshimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/651,075

(22) Filed: Jul. 17, 2017

(65) Prior Publication Data

US 2018/0226961 A1    Aug. 9, 2018

(30) Foreign Application Priority Data

Feb. 6, 2017    (JP) ................. 2017-019337

(51) Int. Cl.
*H03K 5/24* (2006.01)
*G01R 19/00* (2006.01)
*H03F 3/45* (2006.01)

(52) U.S. Cl.
CPC ....... *H03K 5/2481* (2013.01); *G01R 19/0038* (2013.01); *H03F 3/45071* (2013.01); *H03K 5/249* (2013.01)

(58) Field of Classification Search
CPC .... H03K 5/2481; H03K 5/24; H03F 3/45071; G01R 19/0038

USPC .................................................. 327/50–63
See application file for complete search history.

(56) References Cited

U.S. PATENT DOCUMENTS 8,243,866 B2 *  8/2012  Huang ................. H04L 7/0062
                                                       375/340
8,829,953 B1 *  9/2014  Ali ........................ H03K 21/026
                                                       327/115

FOREIGN PATENT DOCUMENTS

| JP | 02-271712 A | 11/1990 |
| JP | 09-074340 A | 3/1997 |
| JP | 10-190420 A | 7/1998 |
| JP | H11-251881 A | 9/1999 |
| JP | 2000-121678 A | 4/2000 |

(Continued)

OTHER PUBLICATIONS

Communication dated Apr. 10, 2018 from the Japanese Patent Office in counterpart Japanese application No. 2017-019337, 8 pages with translation.

*Primary Examiner* — Dinh T Le
(74) *Attorney, Agent, or Firm* — Sughrue Mion, PLLC; Richard C. Turner

(57) ABSTRACT

Provided is a comparator configured to compare input voltages, which are input to a first dynamic comparator and a second dynamic comparator, with a reference voltage, select either an output signal of the first dynamic comparator or an output signal of the second dynamic comparator based on the comparison result, output the selected output signal, and control clock signals, which are input to the first dynamic comparator and the second dynamic comparator respectively, based on the comparison result, so as to stop the operation of the dynamic comparator of which output signal is not selected.

7 Claims, 7 Drawing Sheets

(56) References Cited

FOREIGN PATENT DOCUMENTS

| | | | |
|---|---|---|---|
| JP | 2002-319854 | A | 10/2002 |
| JP | 2006-067556 | A | 3/2006 |
| JP | 2006-300594 | A | 11/2006 |
| JP | 2010-517336 | A | 5/2010 |
| JP | 2012-182638 | A | 9/2012 |

\* cited by examiner

COMPARATOR, AD CONVERTER, SEMICONDUCTOR INTEGRATED CIRCUIT, AND ROTATION DETECTOR

BACKGROUND OF THE INVENTION

1. Field of the Invention

The present invention relates to a comparator having a Rail-to-Rail input voltage range; and an AD (Analog-to-Digital) converter, a semiconductor integrated circuit, and a rotation detector which are equipped with this converter.

2. Description of the Related Art

In prior art, an operation amplifier type comparator having an NMOS differential input stage cannot perform the comparison operation normally if the input voltage is about 1V or less, and an operational amplifier type comparator having a PMOS differential input stage cannot perform the comparison operation normally if the input voltage is (power supply voltage minus about 1V) or more.

Therefore in a conventional operational amplifier type comparator is configured by combining a comparator having an NMOS differential input stage and a comparator having a PMOS differential input stage, so as to have the (Rail-to-Rail) input voltage range from the ground voltage to the power supply voltage (e.g. Japanese Patent Application Laid-open Nos. H10-190420, H2-271712, H9-74340, 2000-121678, Japanese translation of PCT Application No. 2010-517336, and Japanese Patent Application Laid-open No. 2002-319854).

Particularly in the prior art according to Japanese Patent Application Laid-open No. H10-190420, the comparator to perform the comparison operation is switched to the comparator having the NMOS differential input stage or the PMOS differential input stage in accordance with the input voltage.

Further, the prior art includes a logic circuit to stop the operation of either the comparator having the NMOS differential input stage or the comparator having the PMOS differential input stage. Further, the prior art is controlled such that an enable signal is not input to the comparator having the PMOS differential input stage if the input voltage is higher than the reference voltage, and an enable signal is not input to the comparator having the NMOS differential input stage if the input voltage is lower than the reference voltage, whereby the operation state of a comparator which does not perform the comparison operation is turned OFF, and the power consumption is reduced.

SUMMARY OF THE INVENTION

In the case of the above mentioned operational amplifier type comparator, the speed of the comparison operation is slow if the difference of the voltages to be compared is small. Furthermore, if the comparator having the NMOS differential input stage and the comparator having the PMOS differential input stage are combined, and both are operated at the same time, power consumption increases.

If the operation of the comparator, which does not perform the comparison operation, is stopped at this point to reduce the power consumption, it takes time to return the comparator, of which operation is stopped, to the state in which the comparison operation is possible, and a high-speed comparison operation of the comparator cannot be implemented. As a result, the operational amplifier type comparator cannot be applied to the AD converter for which a high-speed conversion operation is demanded.

With the foregoing in view, it is an object of the present invention to provide: a comparator which has the Rail-to-Rail input voltage range and which still can operate at high-speed at low power consumption; and an AD convertor, a semiconductor integrated circuit, and a rotation detector equipped with this comparator.

A comparator according to the present invention has: a first dynamic comparator which includes an NMOS differential input stage, and is configured to perform a comparison operation in synchronization with a clock signal which is input thereto; a second dynamic comparator which includes a PMOS differential input stage, and is configured to perform a comparison operation in synchronization with a clock signal which is input thereto; an output signal selection circuit configured to compare input voltages, which are input to the first dynamic comparator and the second dynamic comparator, with a reference voltage, select either an output signal of the first dynamic comparator or an output signal of the second dynamic comparator based on the comparison result, and output the selected output signal; and a clock input control circuit configured to control the clock signals, which are input to the first dynamic comparator and the second dynamic comparator respectively, based on the comparison result, so as to stop the operation of the dynamic comparator of which output signal is not selected by the output signal selection circuit.

According to the present invention, a comparator which has the Rail-to-Rail input voltage range and which can still operate at high-speed at low power consumption, and an AD converter, a semiconductor integrated circuit, and a rotation detector equipped with this comparator, can be provided.

DESCRIPTION OF THE PREFERRED EMBODIMENTS

A comparator, an AD converter, a semiconductor integrated circuit, and a rotation detector according to the present invention will be described with reference to the drawings. In the description on drawings, an identical or corresponding composing element is denoted with a same reference sign, where redundant description is omitted.

Figure 9:
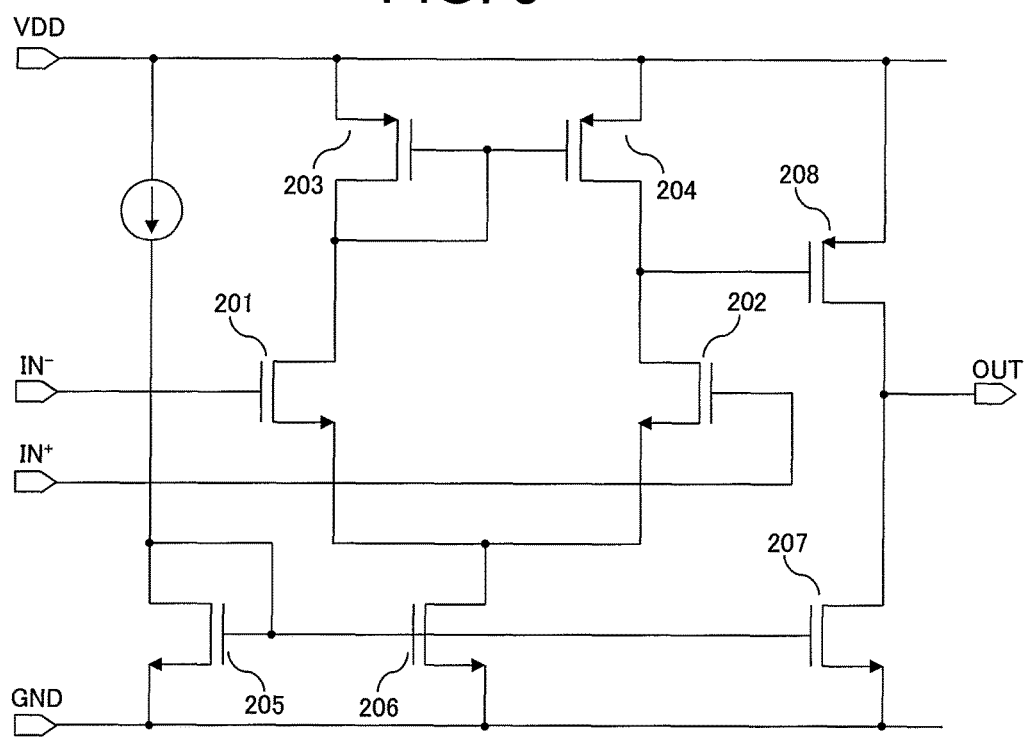
FIG. 9 is a diagram depicting a first example of a conventional operational amplifier type comparator.
Figure 10:
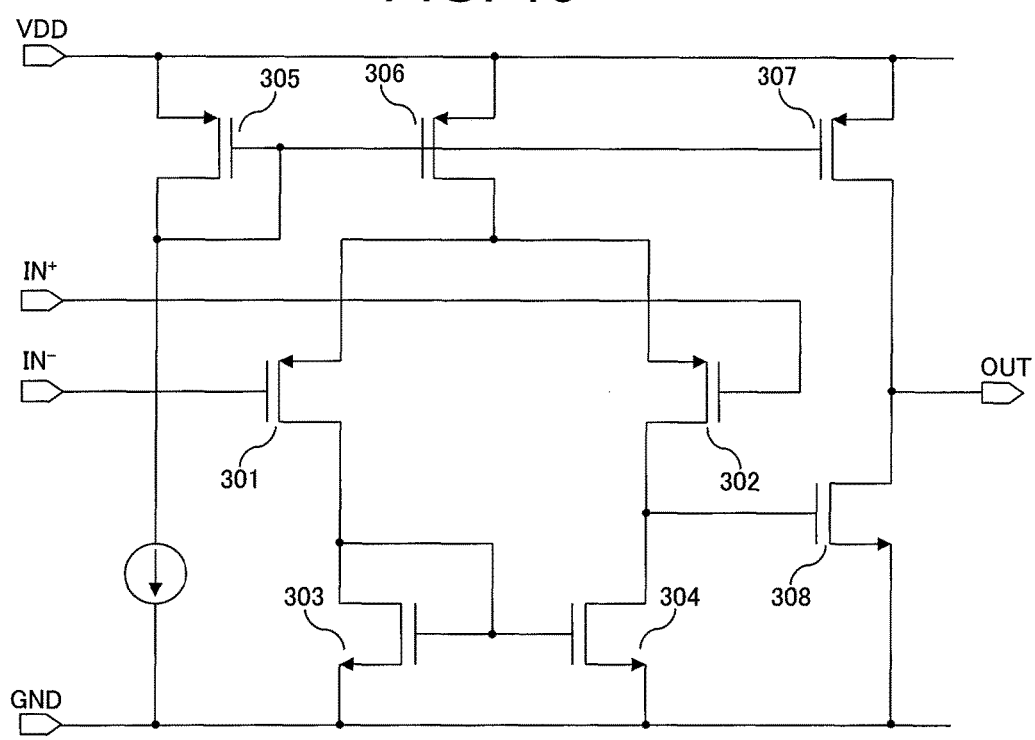
FIG. 10 is a diagram depicting a second example of a conventional operational amplifier type comparator.

First a conventional operational amplifier type comparator will be described with reference to FIG. 9 and FIG. 10, as a comparative example of the comparator according to the present invention. FIG. 9 is a diagram depicting a first example of the conventional operational amplifier type comparator. FIG. 10 is a diagram depicting a second example of the conventional operational amplifier type comparator.

The operational amplifier type comparator depicted in FIG. 9 has: an NMOS differential input stage constituted by an NMOS transistor 201 and an NMOS transistor 202; a current mirror circuit constituted by a PMOS transistor 203 and a PMOS transistor 204; a current source constituted by an NMOS transistor 205, an NMOS transistor 206 and an NMOS transistor 207; and a source grounding output stage constituted by a PMOS transistor 208 of which load is an NMOS transistor 207.

For the NMOS transistor 201 and the NMOS transistor 202 constituting the NMOS differential input stage to operate, the input voltage, which is input to the input terminal IN+ and the input voltage which is input to the input terminal IN−, must be a voltage that is higher than the thresholds of the NMOS transistors. In other words, in order for the NMOS transistor 201 and the NMOS transistor 202 to operate, the input voltage range of the comparator depicted in FIG. 9 is set to a range that is about 1V to the power supply voltage of the voltage source VDD.

The operational amplifier type comparator depicted in FIG. 10 has: a PMOS differential input stage constituted by a PMOS transistor 301 and a PMOS transistor 302; a current mirror circuit constituted by an NMOS transistor 303 and an NMOS transistor 304; a current source constituted by a PMOS transistor 305, a PMOS transistor 306, and a PMOS transistor 307; and a source grounding output stage constituted by an NMOS transistor 308 of which load is a PMOS transistor 307.

For the PMOS transistor 301 and the PMOS transistor 302 constituting the PMOS differential input stage to operate, the input voltage range of the comparator depicted in FIG. 10 is set to a range of the ground voltage of the ground GND to (the power supply voltage minus about 1V).

As described above, in the case of the comparator having the NMOS differential input stage, that is, the comparator depicted in FIG. 9, the comparison operation cannot be performed normally if the input voltage is about 1V or less. In the case of the comparator having the PMOS differential input stage, that is, the comparator depicted in FIG. 10, the comparison operation cannot be performed normally if the input voltage is (the power supply voltage minus about 1V) or more.

Therefore the conventional operational amplifier type comparator is constituted by combining the comparator having the NMOS differential input stage and the comparator having the PMOS differential input stage, so as to implement the Rail-to-Rail input voltage range.

Embodiment 1

Figure 1:
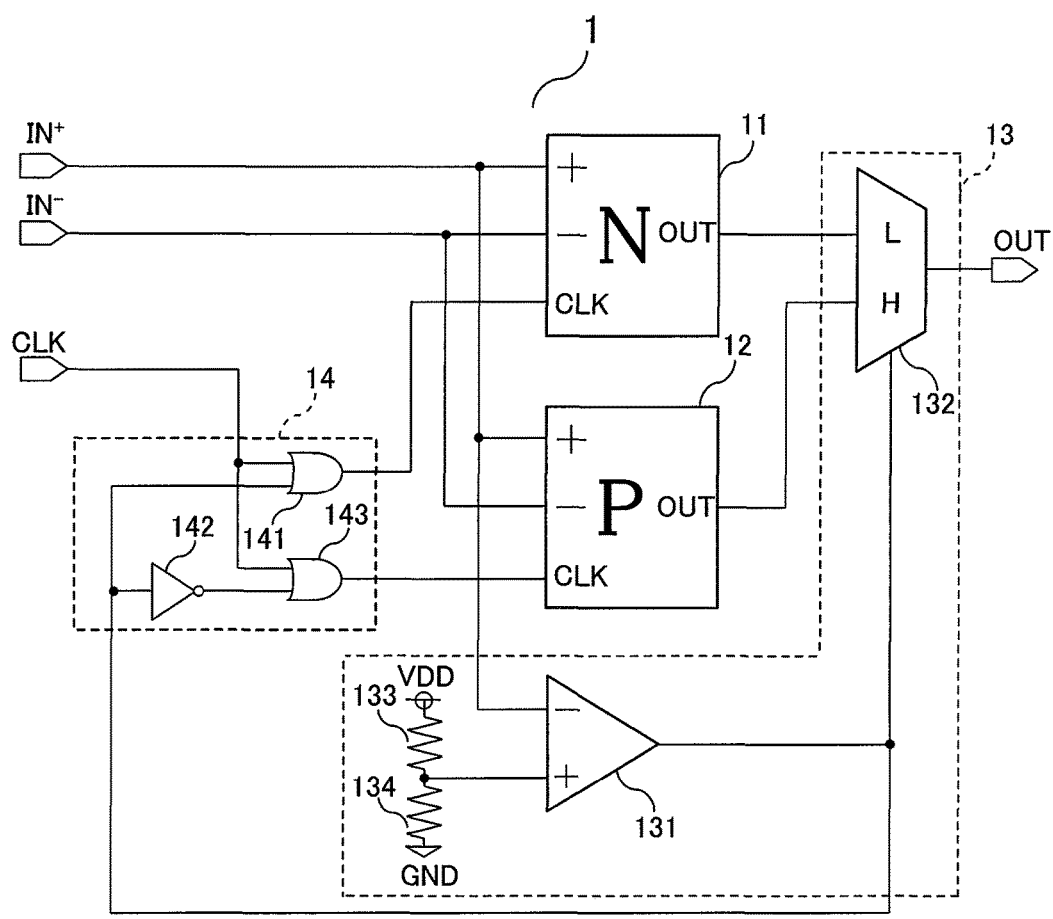
FIG. 1 is a diagram depicting a comparator according to Embodiment 1 of the present invention.
Figure 2:
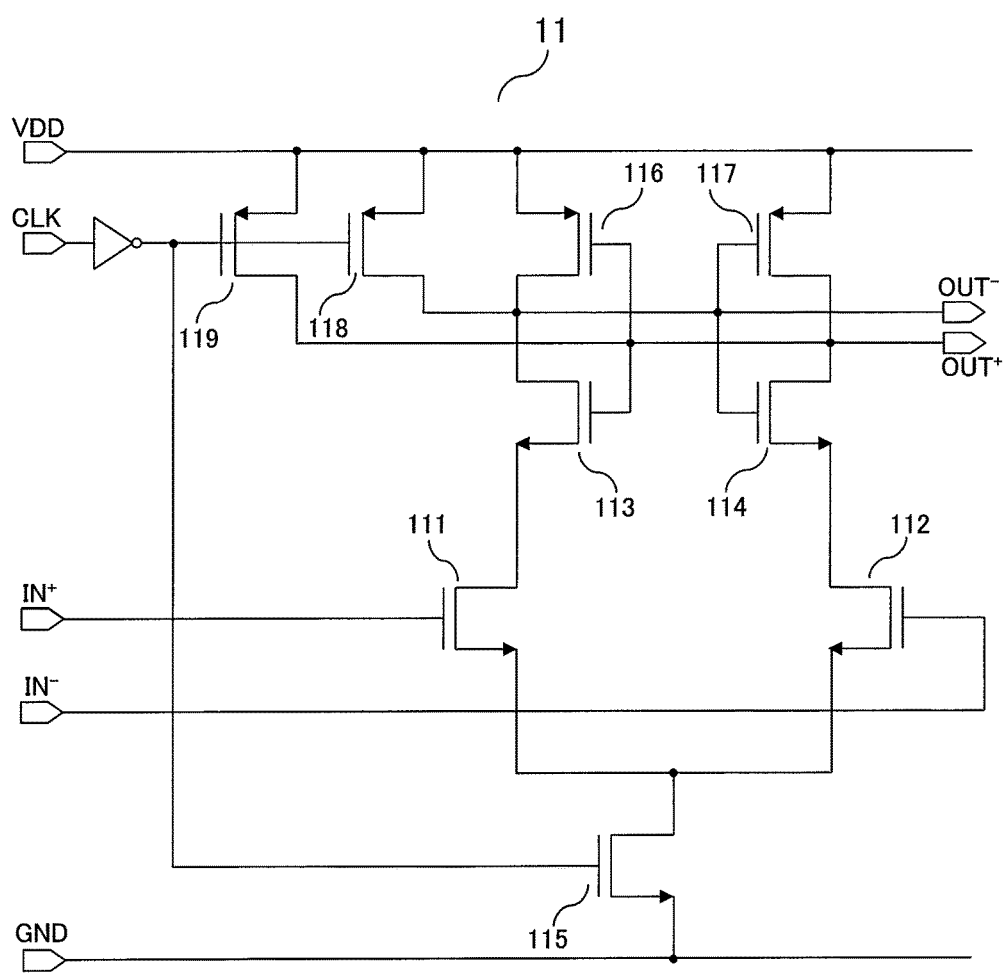
FIG. 2 is a diagram depicting the first dynamic comparator in FIG. 1.
Figure 3:
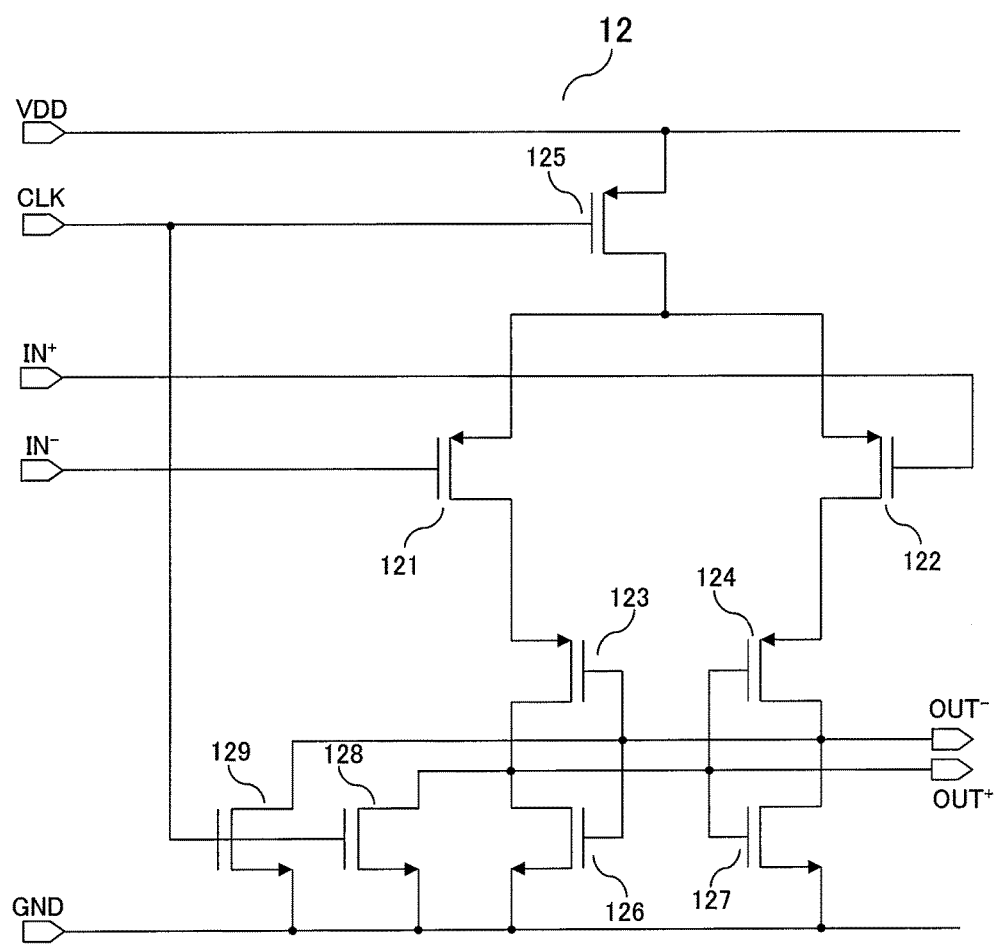
FIG. 3 is a diagram depicting the second dynamic comparator in FIG. 1.

Now a comparator 1 according to Embodiment 1 of the present invention will be described with reference to FIG. 1 to FIG. 3. FIG. 1 is a diagram depicting the comparator 1 according to Embodiment 1 of the present invention. FIG. 2 is a diagram depicting the first dynamic comparator 11 in FIG. 1. FIG. 3 is a diagram depicting a second dynamic comparator 12 in FIG. 1.

The comparator 1 depicted in FIG. 1 has a first dynamic comparator 11, a second dynamic comparator 12, an output signal selection circuit 13, and a clock input control circuit 14.

A circuit configuration of a comparator, which is generally referred to as a strong arm type comparator, is applied to the first dynamic comparator 11 depicted in FIG. 2. The input voltage range of the first dynamic comparator is set to the range from about 1V to the power supply voltage. Further, this range is set such that a signal, which is output from an output terminal OUT+ or an output terminal OUT− depicted in FIG. 2, is output as an output signal of the first dynamic comparator 11.

The first dynamic comparator 11 has: an NMOS differential input stage constituted by an NMOS transistor 111 and an NMOS transistor 112; a latch circuit constituted by an NMOS transistor 113, an NMOS transistor 114, a PMOS transistor 116 and a PMOS transistor 117; and an NMOS transistor 115, a PMOS transistor 118 and a PMOS transistor 119, which are switches to turn ON/OFF in synchronization with a clock signal which is input to a clock signal terminal CLK.

When the clock signal is a High level signal, the PMOS transistor 118 and the PMOS transistor 119 turn ON, and the NMOS transistor 115 turns OFF. In this case, the power supply voltage level of the voltage source VDD is output from the output terminal OUT+ and the output terminal OUT−.

When the clock signal is switched from High level to Low level, the PMOS transistor 118 and the PMOS transistor 119 turn OFF, and the NMOS transistor 115 turns ON. In this case, electric charges move from the output terminal OUT+ and the output terminal OUT− to the ground GND via the NMOS differential input stage and the NMOS transistor 115, whereby the voltages at the output terminal OUT+ and the output terminal OUT− decrease.

At this time, the current capability difference, corresponding to the voltage difference between an input terminal IN+ and an input terminal IN− connected to the NMOS differential input stage, is generated between the NMOS transistor 111 and the NMOS transistor 112. As a result, a difference is generated between the voltage decreasing speed of the output terminal OUT+ and that of the output terminal OUT−. This difference in the voltage decreasing speed is detected by the latch circuit, whereby the voltage input to the input terminal IN+ and the voltage input to the input terminal IN− are compared.

In this way, the first dynamic comparator 11 has the NMOS differential input stage, and is configured to perform the comparison operation in synchronization with the clock signal which is input thereto.

The second dynamic comparator 12 depicted in FIG. 3 performs the same comparison operation as the first dynamic comparator 11. The input voltage range of the second dynamic comparator 12 is set to the range from the ground voltage to the (power supply voltage minus about 1V). Further, this range is set such that the signal output from the output terminal OUT+ or the output terminal OUT− depicted in FIG. 3 is output as the output signal of the second dynamic comparator 12.

The second dynamic comparator 12 has: a PMOS differential input stage constituted by a PMOS transistor 121 and a PMOS transistor 122; a latch circuit constituted by a PMOS transistor 123, a PMOS transistor 124, an NMOS transistor 126 and an NMOS transistor 127; and a PMOS transistor 125, an NMOS transistor 128 and an NMOS transistor 129, which are switches to turn ON/OFF in synchronization with a clock signal which is input to a clock signal terminal CLK.

When the clock signal is High level, the NMOS transistor 128 and the NMOS transistor 129 turn ON, the PMOS transistor 125 turns OFF. In this case, the ground voltage level of the ground GND is output from the output terminal OUT+ and the output terminal OUT−.

When the clock signal is switched from High level to Low level, the NMOS transistor 128 and the NMOS transistor 129 turn OFF, and the PMOS transistor 125 turns ON. In this case, electric charges move from the voltage source VDD to the output terminal OUT+ and the output terminal OUT− via the PMOS differential input stage and the PMOS transistor 125, whereby the voltages at the output terminal OUT+ and the output terminal OUT− increase.

At this time, the current capability difference, corresponding to the voltage difference between an input terminal IN+ and an input terminal IN− which are connected to the PMOS differential input stage, is generated between the PMOS transistor 121 and the PMOS transistor 122. As a result, a difference is generated in the voltage increasing speed of the output terminal OUT+ and that of the output terminal OUT−. This difference of the voltage increasing speed is detected by the latch circuit, whereby the voltage input to the input terminal IN+ and the voltage input to the input terminal IN− are compared.

In this way, the second dynamic comparator 12 has the PMOS differential input stage, and is configured to perform the comparison operation in synchronization with the clock signal which is input thereto.

The output signal selection circuit 13 generates the reference voltage by dividing the power supply voltage, and compares the input voltage which is input to the input terminal IN+, with the generated reference voltage. Based on this comparison result, the output signal selection circuit 13 selects either the output signal of the first dynamic comparator 11 or the output signal of the second dynamic comparator 12, and outputs the selected output signal.

In concrete terms, the output signal selection circuit 13 is constituted by: a resistor 133 and a resistor 134 which generate the reference voltage by dividing the power supply voltage; a selection comparator 131; and a multiplexer 132.

The resistor 133 and the resistor 134 are connected in series. One end of the resistor 133 is connected to the voltage source VDD, and the other end is connected to a non-inverting input terminal of the selection comparator 131. And one end of the resistor 134 is connected to the non-inverting input terminal of the selection comparator 131, and the other end is connected to the ground GND. The resistor 133 and the resistor 134 generate the reference voltage by dividing the power supply voltage.

The reference voltage is appropriately set such that the NMOS differential input stage of the first dynamic comparator 11 and the PMOS differential input stage of the second dynamic comparator 12 operate respectively. By appropriately setting the reference voltage like this, the output signal selection circuit 13 selects the output signal of the first dynamic comparator 11 if the input voltage is higher than the reference voltage, and selects the output signal of the second dynamic comparator 12 if the input voltage is lower than the reference voltage.

The input voltage input to the input terminal IN+ is input to the inverting input terminal of the selection comparator 131. The selection comparator 131 compares the input voltage input to the input terminal IN+ and the reference voltage generated by the resistor 133 and the resistor 134, and outputs the comparison result. In concrete terms, the selection comparator 131 outputs a Low level signal or a High level signal as the comparison result. The selection comparator 131 outputs the Low level signal if the input voltage is higher than the reference voltage, and outputs the High level signal if the input voltage is lower than the reference voltage.

The multiplexer 132 selects either the output signal of the first dynamic comparator 11 or the output signal of the second dynamic comparator 12 based on the comparison result that is output from the selection comparator 131, and outputs the selected signal to the output terminal OUT. The multiplexer 132 selects the output signal of the first dynamic comparator 11 if the output signal of the selection comparator 131 is the Low level signal, and selects the output signal of the second dynamic comparator 12 if the output signal of the selection comparator 131 is the High level signal.

Thus, by combining the first dynamic comparator 11 and the second dynamic comparator 12, of which input voltage range is different from each other, using the output signal selection circuit 13, the comparator 1 having the Rail-to-Rail input voltage range can be configured.

Based on the comparison result of the output signal selection circuit 13, the clock input control circuit 14 controls the clock signals, which are input to the first dynamic comparator 11 and the second dynamic comparator 12 respectively, so as to stop the operation of the dynamic comparator of which output signal is not selected by the output signal selection circuit 13.

In concrete terms, the clock input control circuit 14 is constituted by an OR gate 141, a NOT gate 142 and an OR gate 143.

The OR gate 141 computes the logical OR of the clock signal which is input to the clock signal terminal CLK and the output signal of the selection comparator 131, and outputs the computing result to the first dynamic comparator 11. For example, if the clock signal is a High level signal and the output signal of the selection comparator 131 is a Low level signal, the OR gate 141 outputs the High level signal to the first dynamic comparator 11.

The NOT gate 142 computes the logical NOT of the output signal of the selection comparator 131, and outputs the computing result to the OR gate 143. For example, if the output signal of the selection comparator 131 is a Low level signal, the NOT gate 142 outputs a High level signal to the OR gate 143.

The OR gate 143 computes the logical OR of the clock signal which is input to the clock signal terminal CLK and the output signal of the NOT gate 142, and outputs the computing result to the second dynamic comparator 12. For example, if the clock signal is a Low level signal and the output signal of the NOT gate 142 is a High level signal, the OR gate 143 outputs the High level signal to the second dynamic comparator 12.

In other words, the clock input control circuit 14 fixes the level of the clock signal, which is input to the second dynamic comparator 12, to High level if the output signal of the selection comparator 131 is a Low level signal. Therefore the operation of the second dynamic comparator 12, of which output signal is not selected by the output signal selection circuit 13, can be stopped without affecting the output of the comparator 1.

If the output signal of the selection comparator 131 is a High level signal, on the other hand, the clock input control circuit 14 fixes the level of the clock signal, which is input to the first dynamic comparator 11, to High level. Therefore the operation of the first dynamic comparator 11, of which output signal is not selected by the output signal selection circuit 13, can be stopped without affecting the output of the comparator 1.

By configuring the clock input control circuit 14 like this, operation of the second dynamic comparator 12 can be stopped if the input voltage, which is input to the input terminal IN+, is higher than the reference voltage, and operation of the first dynamic comparator 11 can be stopped if the input voltage, which is input to the input terminal IN+, is lower than the reference voltage. Therefore operation of the dynamic comparator, of which output signal is not selected by the output signal selection circuit 13, can be stopped, and as a result, an increase in the current consumption can be suppressed without affecting the operation of the comparator 1.

Here in the case of the conventional dynamic comparator, which is configured to perform the comparison operation at a timing when the rise edge or the fall edge of the clock signal is input, the current consumption increases at the same time as the comparison operation. Further, in the case of the operational amplifier type comparator, the circuit operation must be stopped in the non-operating state to reduce power consumption. In the case of the comparator 1 according to Embodiment 1, on the other hand, the current consumption can be reduced by controlling the clock signals which are input to the first dynamic comparator 11 and the second dynamic comparator 12 respectively. Therefore in the comparator 1 according to Embodiment 1, the return operation, needed for the operational amplifier type comparator, is not needed, and power consumption can be suppressed while maintaining high-speed operation.

In Embodiment 1, a case when the output signal selection circuit 13 has a resistor which generates a reference voltage by dividing the power supply voltage was described as a configuration example for the output signal selection circuit 13 to generate the reference voltage. However, the configuration for the output signal selection circuit 13, to generate the reference voltage, is not limited to this, but can be any configuration as long as the reference voltage can be generated.

As described above, according to Embodiment 1, the input voltages which are input to the first dynamic comparator and the second dynamic comparator are compared with the reference voltage, and either the output signal of the first dynamic comparator or the output signal of the second dynamic comparator is selected based on the comparison result, and the selected output signal is output.

Further, in the above configuration, the clock signals which are input to the first dynamic comparator and the second dynamic comparator respectively are controlled based on the comparison result, so as to stop operation of the dynamic comparator of which output signal is not selected.

Thereby a comparator which has the Rail-to-Rail input voltage range and which can still operate at high-speed at low power consumption can be implemented.

Embodiment 2

In Embodiment 2 of the present invention, a comparator 1, in which the output signal selection circuit 13 is different from that of the configuration of Embodiment 1, will be described. In Embodiment 2, description on aspects that are the same as Embodiment 1 is omitted, and aspects that are different from Embodiment 1 will primarily be described.

Figure 4:
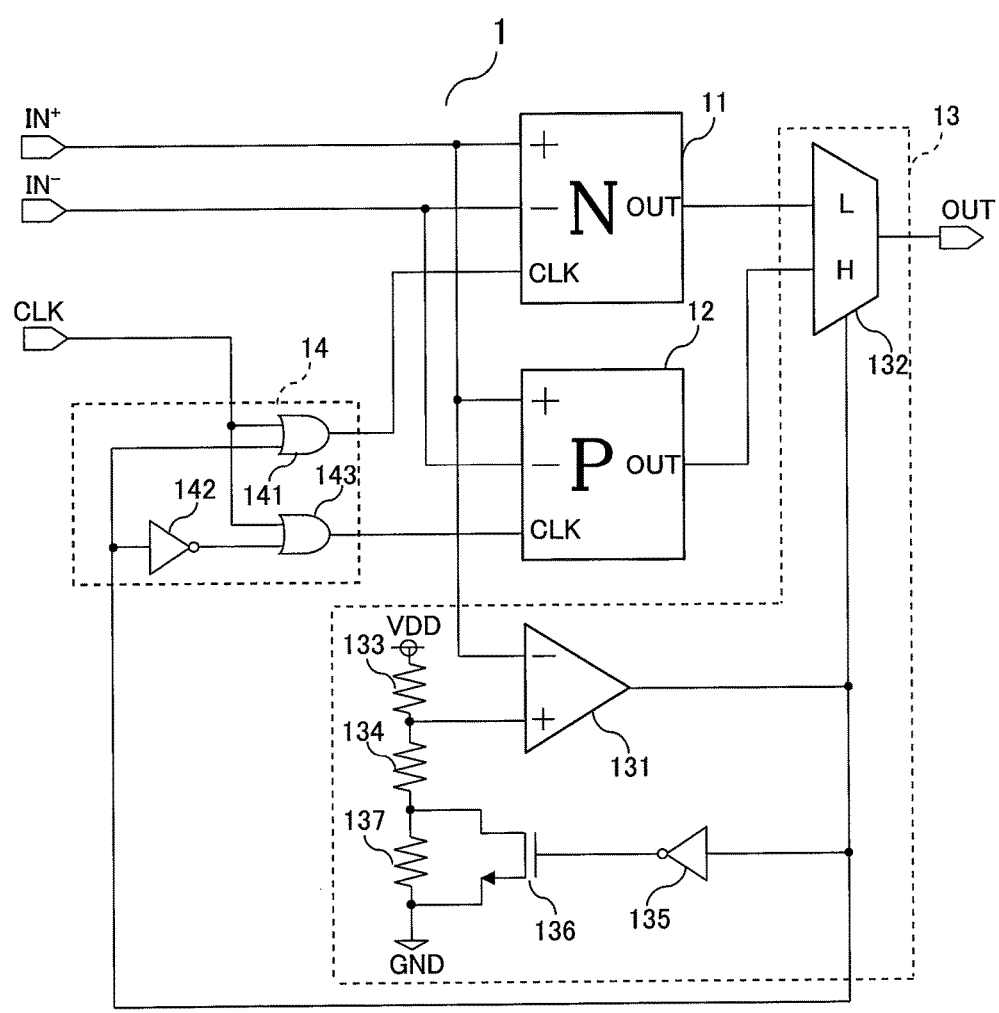
FIG. 4 is a diagram depicting a comparator according to Embodiment 2 of the present invention.

FIG. 4 is a diagram depicting the comparator 1 according to Embodiment 2 of the present invention. The comparator 1 depicted in FIG. 4 has a first dynamic comparator 11, a second dynamic comparator 12, an output signal selection circuit 13, and a clock input control circuit 14.

The output signal selection circuit 13 is constituted by a selection comparator 131, a multiplexer 132, a resistor 133, a resistor 134, a NOT gate 135, an NMOS transistor 136, and a resistor 137.

The resistor 133, the resistor 134 and the resistor 137 are connected in series, the resistor 133 is connected to the voltage source VDD, and the resistor 137 is connected to the ground GND. The NMOS transistor 136 is connected to the resistor 137 in parallel.

When the operation state of the NMOS transistor 136 is ON, the power supply voltage is divided by the resistor 133 and the resistor 134, whereby the reference voltage is generated. When the operation state of the NMOS transistor 136 is OFF, on the other hand, the power supply voltage is divided by the resistor 133, the resistor 134 and the resistor 137, whereby the reference voltage is generated.

The NOT gate 135 computes the logical NOT of the output signal of the selection comparator 131, and outputs the computing result to the NMOS transistor 136. If the output signal of the selection comparator 131 is a Low level signal, the NOT gate 135 outputs a High level signal to the NMOS transistor 136. In this case, the operation state of the NMOS transistor 136 becomes ON.

If the output signal of the selection comparator 131 is a High level signal, on the other hand, the NOT gate 135 outputs a Low level signal to the NMOS transistor 136. In this case, the operation state of the NMOS transistor 136 becomes OFF.

In this way, the output signal selection circuit 13 is configured to make the reference voltage variable by switching the resistance value of the resistor which generates the reference voltage, based on the comparison result output from the selection comparator 131. Therefore hysteresis is generated in the threshold of the selection comparator 131 by the output signal of the selection comparator 131, whereby chatter, such as noise, can be prevented, and the comparison operation of the selection comparator 131 can be stabilized.

As described above, according to Embodiment 2, the output signal selection circuit in the above mentioned Embodiment 1 is configured to make the reference voltage variable by switching the resistance value of the resistor based on the comparison result output from the selection comparator. Thereby not only can an effect the same as Embodiment 1 be acquired, but also chatter, such as noise, can be prevented, and the comparison operation of the selection comparator can be stabilized.

Embodiment 3

In Embodiment 3 of the present invention, a comparator 1, in which a first pre-amplifier 15 and a second pre-amplifier 16 are added to the configuration in Embodiment 2, will be described. In Embodiment 3, description on aspects that are the same as Embodiments 1 and 2 is omitted, and aspects that are different from Embodiments 1 and 2 will primarily be described.

Figure 5:
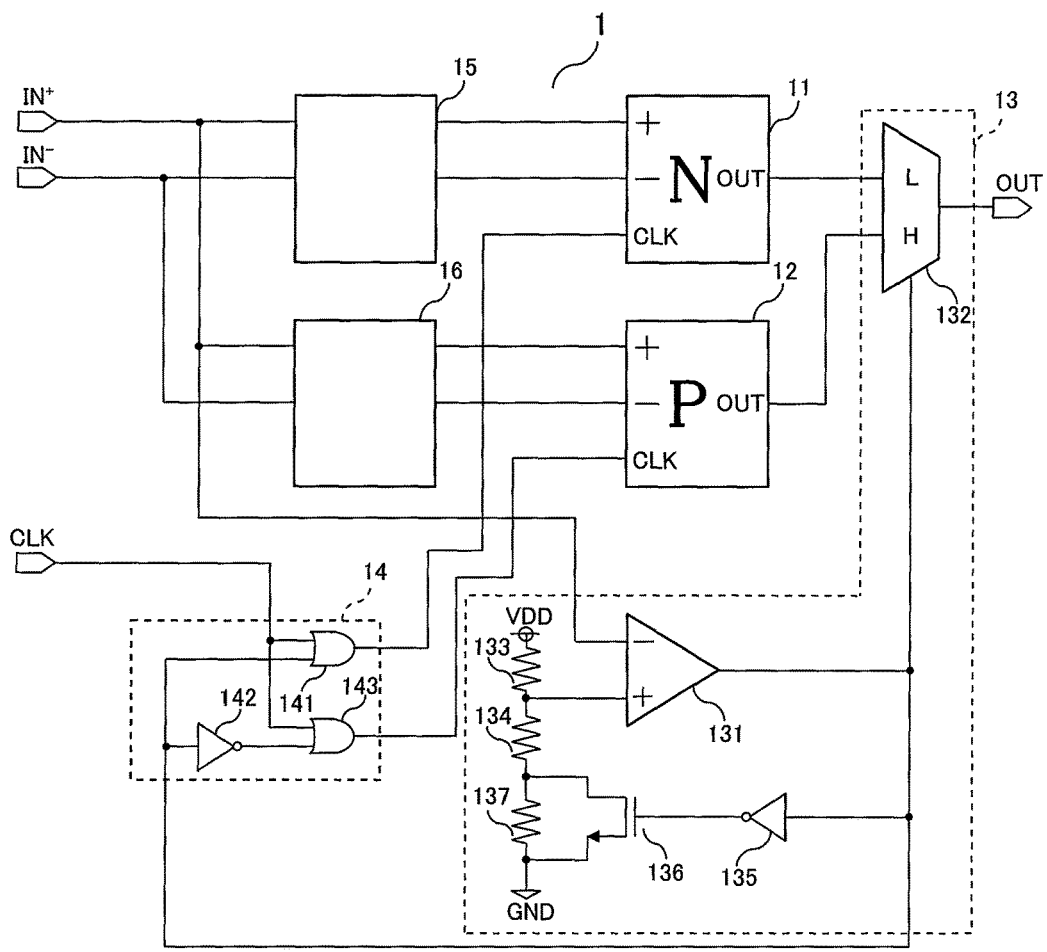
FIG. 5 is a diagram depicting a comparator according to Embodiment 3 of the present invention.

FIG. 5 is a diagram depicting the comparator 1 according to Embodiment 3 of the present invention. The comparator 1 depicted in FIG. 5 has a first dynamic comparator 11, a second dynamic comparator 12, an output signal selection circuit 13, a clock input control circuit 14, a first pre-amplifier 15, and a second pre-amplifier 16.

In each of the first dynamic comparator 11 and the second dynamic comparator 12, kick-back noise, which is the result of a voltage change in the internal node of the comparator that is transferred to the input voltage, may be generated during the comparison operation, and as a result, may affect the comparison operation.

Therefore the comparator 1 according to Embodiment 3 is configured such that the first pre-amplifier 15 is disposed in the previous stage of the first dynamic comparator 11, and the second pre-amplifier 16 is disposed in the previous stage of the second dynamic comparator 12. For the first pre-amplifier 15 and the second pre-amplifier 16, a known pre-amplifier, which can suppress the influence of the kick-back noise and stabilize the comparison operation, can be used.

By this configuration, the influence of the kick-back noise can be suppressed in the first dynamic comparator 11 and the second dynamic comparator 12 respectively, whereby the comparison operation can be stabilized.

The same effect can be acquired as well by disposing the first pre-amplifier 15 in the previous stage of the first dynamic comparator 11 and the second pre-amplifier 16 in the previous stage of the second dynamic comparator 12 in the configuration of the comparator according to Embodiment 1.

As described above, according to Embodiment 3, the first pre-amplifier disposed in the previous stage of the first dynamic comparator and the second pre-amplifier disposed in the previous stage of the second dynamic comparator, are added to the configuration of Embodiment 1 or 2 described above. Thereby not only can the same effect as Embodiment 1 or 2 be acquired, but also the influence of the kick-back noise can be prevented, and the comparison operation can be stabilized in the first dynamic comparator and the second dynamic comparator respectively.

Embodiment 4

In Embodiment 4 of the present invention, a case of using any one of the above mentioned comparators 1 according to Embodiment 1 to 3 described above, for a comparator constituting a known AD convertor, will be described. In Embodiment 4, description on aspects that are the same as Embodiments 1 to 3 is omitted, and aspects that are different from Embodiments 1 to 3 will primarily be described.

Figure 6:
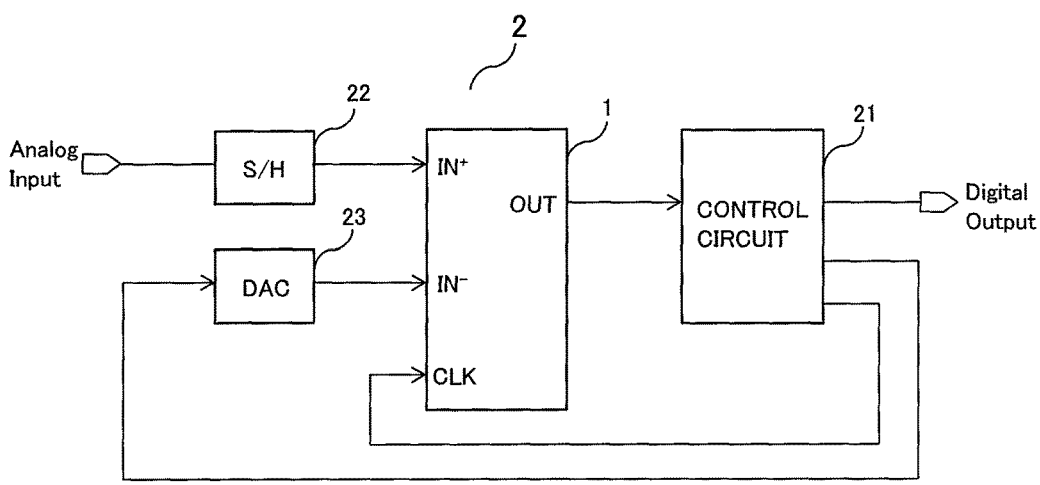
FIG. 6 is a diagram depicting an AD converter according to Embodiment 4 of the present invention.

FIG. 6 is a diagram depicting an AD converter 2 according to Embodiment 4 of the present invention. The AD converter 2 depicted in FIG. 6 has: a sample-hold circuit 22; a DA converter 23; a comparator 1; a control circuit 21 configured to input a clock signal to the comparator 1, and to control the DA converter 23 and the like; a terminal to which an analog signal is input; and a terminal from which a digital signal is output.

In this way, any one of the comparators 1 according to Embodiments 1 to 3 can be used for the comparator constituting a known AD converter.

As described above, according to Embodiment 4, any one of the above mentioned comparators according to Embodiments 1 to 3 is used for the comparator constituting a known AD converter. Thereby an AD converter equipped with a comparator, which has a Rail-to-Rail input voltage range and still operates at high-speed and low power consumption can be implemented. Further, by using any one of the comparators according to Embodiments 1 to 3 for the comparator constituting a known AD converter, an AD converter which can perform high-speed conversion operation and still reduce power consumption can be implemented.

Embodiment 5

In Embodiment 5 of the present invention, a case of using the above mentioned AD converter 2 according to Embodiment 4, for an AD converter constituting a known semiconductor integrated circuit, will be described. In Embodiment 5, description on aspects that are the same as Embodiments 1 to 4 is omitted, and aspects that are different from Embodiments 1 to 4 will primarily be described.

Figure 7:
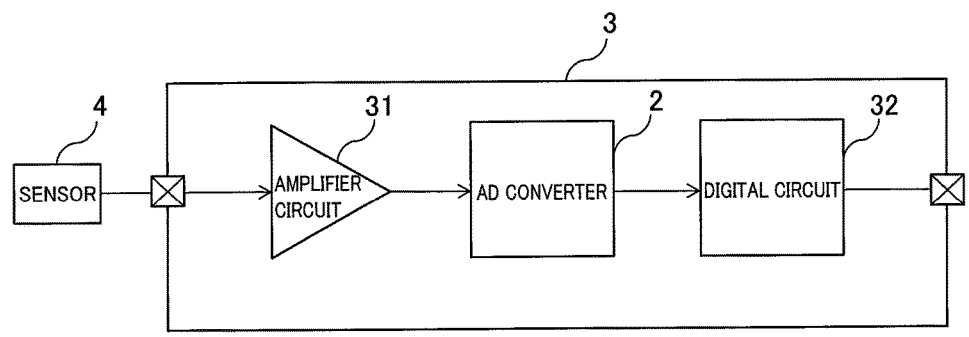
FIG. 7 is a diagram depicting a semiconductor integrated circuit according to Embodiment 5 of the present invention.

FIG. 7 is a diagram depicting a semiconductor integrated circuit 3 according to Embodiment 5 of the present invention. The semiconductor integrated circuit 3 depicted in FIG. 7 has: an amplifier circuit 31 configured to amplify a sensor signal which is input from a sensor 4; an AD converter 2 configured to convert the output of the amplifier circuit 31 to a digital signal; and a digital circuit 32 configured to signal-process the output of the AD converter 2.

Here the amplitude of the sensor signal must be amplified by the amplifier circuit 31, since the sensor signal is a weak signal in general. By using the AD converter 2 as the AD converter for converting the output of the amplifier circuit 31 into a digital signal, the AD conversion can be performed even if the sensor signal is amplified to the power supply voltage level by the amplifier circuit 31. Therefore an amplifier circuit having a higher amplification degree can be used, whereby the sensor signal can be processed at higher precision.

In this way, the AD converter 2 equipped with any one of the comparators 1 according to Embodiments 1 to 3 can be used for an AD converter constituting a known semiconductor integrated circuit.

As described above, according to Embodiment 5, the AD converter equipped with any one of the above mentioned comparators according to Embodiments 1 to 3 is used for the AD converter constituting a known semiconductor integrated circuit. Thereby a semiconductor integrated circuit equipped with a comparator, which has the Rail-to-Rail input voltage range and still operates at high-speed at low power consumption, can be implemented.

Embodiment 6

In Embodiment 6 of the present invention, a case of using the above mentioned semiconductor integrated circuit 3 according to Embodiment 5, for a semiconductor integrated circuit constituting a known rotation detector, will be described. In Embodiment 6, description on aspects that are the same as embodiments 1 to 5 is omitted, and aspects that are different from Embodiments 1 to 5 will primarily be described.

Figure 8:
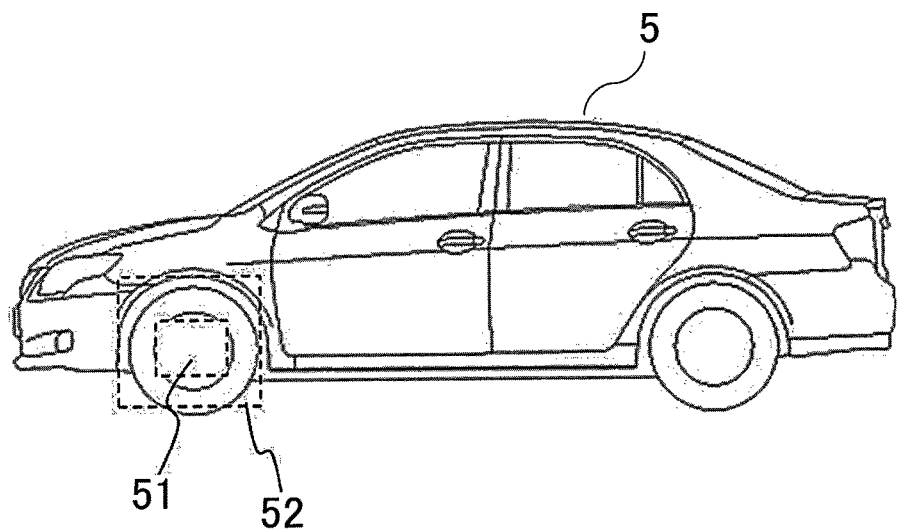
FIG. 8 is a diagram depicting a vehicle according to Embodiment 6 of the present invention.

FIG. 8 is a diagram depicting a vehicle 5 according to Embodiment 6 of the present invention. The vehicle 5 depicted in FIG. 8 has wheels 51, and a rotation detector 52 which includes the semiconductor integrated circuit 3. The rotation detector 52 detects the rotation of the rotary shaft of a rotating device installed in the vehicle 5, such as a rotary shaft of the wheel 51.

Here various on-board detectors, such as the rotation detector 52, are demanded to operate at high precision and at low power consumption due to high mileage requirements. These demands are satisfied by using the semiconductor integrated circuit 3 for the semiconductor integrated circuit constituting various detectors.

In this way, the semiconductor integrated circuit 3 equipped with any one of the comparators 1 according to Embodiments 1 to 3 can be used for the semiconductor integrated circuit constituting a known rotation detector.

According to Embodiment 6, the semiconductor integrated circuit equipped with any one of the above mentioned comparators according to Embodiments 1 to 3 is used for the semiconductor integrated circuit constituting a known rotation detector. Thereby a rotation detector equipped with a comparator, which has the Rail-to-Rail input voltage range and still operates at high-speed at low power consumption, can be implemented.

Embodiments 1 to 6 were described as examples of the present invention, but the present invention is not limited to each configuration of Embodiments 1 to 6, and each configuration of Embodiments 1 to 6 may be appropriately combined, may be partially modified, or may be partially omitted within a scope that does not depart from the spirit of the present invention.

What is claimed is:

1. A comparator comprising:
   a first dynamic comparator which includes an NMOS differential input stage, and is configured to perform a comparison operation in synchronization with a clock signal, which is input thereto, and to output an output signal;
   a second dynamic comparator which includes a PMOS differential input stage, and is configured to perform a comparison operation in synchronization with a clock signal which is input thereto, and to output an output signal;
   an output signal selection circuit configured to compare an input voltage, which is input to the first dynamic comparator and an input voltage which is input to the second dynamic comparator, with a reference voltage, generate a comparison result signal, select the output signal received from of the first dynamic comparator or the output signal received from the second dynamic comparator based on the comparison result signal, and output the selected output signal; and
   a clock input control circuit configured to receive the comparison result signal from the output signal selection circuit, and control an input of the clock signals to the first dynamic comparator and the second dynamic comparator, respectively, based on the comparison result signal, so as to stop the comparison operation of a dynamic comparator, among the first dynamic comparator and the second dynamic comparator, of which the output signal is not selected by the output signal selection circuit.

2. The comparator according to claim 1, wherein the output signal selection circuit includes:
   a resistor configured to generate the reference voltage by dividing a power supply voltage;
   a selection comparator configured to compare the input voltage which is input to the first dynamic comparator and the input voltage which is input to the second dynamic comparator with the reference voltage which is generated by the resistor, and output the comparison result signal; and
   a multiplexer configured to select the output signal of the first dynamic comparator or the output signal of the second dynamic comparator based on the comparison result signal which is output from the selection comparator, and output the selected output signal.

3. The comparator according to claim 2, wherein the resistor is included into a plurality of resistors, and
   the output signal selection circuit is configured to make the reference voltage variable by using different resistance values of the plurality of resistors.

4. The comparator according to claim 1, further comprising:
   a first preamplifier connected at an input terminal of the first dynamic comparator; and
   a second preamplifier connected at an input terminal of the second dynamic comparator.

5. An AD converter comprising the comparator according to claim 1.

6. A semiconductor integrated circuit comprising the AD converter according to claim 5.

7. A rotation detector comprising the semiconductor integrated circuit according to claim 6.

* * * * *